(12) United States Patent
Priel et al.

(10) Patent No.: US 7,836,369 B2
(45) Date of Patent: Nov. 16, 2010

(54) DEVICE AND METHOD FOR CONFIGURING INPUT/OUTPUT PADS

(75) Inventors: Michael Priel, Hertzelia (IL); Dan Kuzmin, Givat Shmuel (IL); Anton Rozen, Gedera (IL)

(73) Assignee: Freescale Semiconductor, Inc, Austin, TX (US)

(*) Notice: Subject to any disclaimer, the term of this patent is extended or adjusted under 35 U.S.C. 154(b) by 255 days.

(21) Appl. No.: 12/092,463

(22) PCT Filed: Nov. 2, 2005

(86) PCT No.: PCT/IB2005/053581

§ 371 (c)(1),
(2), (4) Date: May 2, 2008

(87) PCT Pub. No.: WO2007/052090

PCT Pub. Date: May 10, 2007

(65) Prior Publication Data

US 2008/0270858 A1    Oct. 30, 2008

(51) Int. Cl.
*G01R 31/28* (2006.01)
*G06F 3/00* (2006.01)
(52) U.S. Cl. .............. 714/727; 710/8; 710/36
(58) Field of Classification Search ............ None
See application file for complete search history.

(56) References Cited

U.S. PATENT DOCUMENTS

| | | | |
|---|---|---|---|
| 5,847,561 A * | 12/1998 | Whetsel | 324/158.1 |
| 6,219,812 B1 | 4/2001 | Golshan | |
| 6,851,079 B1 | 2/2005 | Hergott | |
| 2003/0115555 A1 | 6/2003 | Wissel | |
| 2004/0117698 A1 | 6/2004 | Tran et al. | |

OTHER PUBLICATIONS

IEEE Standard 1149.1-2001 (R2008); "IEEE Standard Test Access Port and Boundary-Scan Architecture".
DeHon et al; "Automatic Impedance Control"; ISSCC 93, Sesion 10, High-Speed Communication and Interfaces, Paper 10.7.

* cited by examiner

*Primary Examiner*—Alan Chen
(74) *Attorney, Agent, or Firm*—Reches Patents

(57) ABSTRACT

A method for configuring IO pads, the method includes determining a current configuration of multiple IO pads of an integrated circuit and whereas the method is characterized by generating multiple boundary scan register words that comprise Configuration information; and repeating the stage of serially writing a certain boundary scan register word to a boundary scan register and outputting the boundary scan register word to multiple IO pad control circuits. A device that includes a core, connected to a boundary scan register, a TAP controller and multiple IO pad circuits, the device is characterized by including a control circuit adapted to determine a current configuration of the IO pads, to generate multiple boundary scan register words that comprise configuration information; and to control a repetition of: writing a certain boundary scan register word to the boundary scan register and outputting the boundary scan register word to multiple IO pad control circuits.

20 Claims, 8 Drawing Sheets

DEVICE AND METHOD FOR CONFIGURING INPUT/OUTPUT PADS

FIELD OF THE INVENTION

The present invention relates to a device and to a method for configuring Input/Output (IO) pads.

BACKGROUND OF THE INVENTION

Integrated circuits include multiple input/output (IO) pads that are used to convey signals to the integrated circuit and from the integrated circuit. Some IO pad circuits are used only to receive signals, other IO pad circuits are used to output signals and some IO pad circuits are used to receive signals and to output signals.

Usually, the number of signals that should be exchanged between the integrated circuit and its environment well exceeds the number of IO pad circuits, thus time division multiplexing is applied.

IO pads are required to change their characteristics (such as impedance, drive strength, slew rate and the like) in response to the functions that they are currently executing. In order to support these relatively rapid IO characteristic changes configurable IO pad circuits were developed.

Usually, a configurable IO pad circuit includes a control/configuration circuit and an IO pad. For simplicity of explanation the control/configuration circuits are referred to as control circuits.

The number of IO pad circuit configuration control signals is relatively large and can exceed ten. Multiple IO pad circuit configuration control signals form a multi-bit IO pad circuit configuration control word.

These signals are usually routed in dedicated IO channels that are relatively area-consuming and their design is relatively time consuming and complex. In a typical base-band integrated circuit the IO channels can require a total area of about two square millimeters.

FIG. 1 illustrates a lower part of an integrated circuit 5. IO pad circuits 6 surround IO channels 7 that in turn surround a portion 8 of the integrated circuit 5 that is not physically connected to the integrated circuit environment. Portion 8 can include one or more transistor based component such as but not limited to processors, memory units, logic and the like.

A more detailed illustration of configurable IO pad circuits and methods for configuring IO pad circuits are also illustrated in U.S. Pat. No. 6,851,079 of Hergott titled "JTAG test access port controller used to control input/output pad functionality", and U.S. patent application serial number 2004/0117698 of Tran et al., titled "Programmable management IO pads for an integrated circuit", which are incorporated herein by reference.

FIG. 2 illustrates a prior art integrated circuit 9 that includes IO pad circuits. An IO pad circuit includes an IO pad (POUT) 28 and an IO pad control circuit (PCNT) 29 that can receive information from JTAG compliant boundary scan cells. A PCNT 29 receives IO pad circuit configuration signals (denoted "control") from core 11. The IO pad circuit configuration signals are routed via n IO channels, such as IO channels 7 of FIG. 1.

JTAG (also known as IEEE standard 1149.1) was designed in order to test integrated circuits. The IEEE standard 1149.1 defines a test access port (TAP) that may be used to access internal components of an integrated circuit. The TAP includes a boundary scan register 30, a one-bit long bypass register 12, an instruction register 18, a TAP controller 20, and an optional user defined data register 14.

A TAP receives various signals including a clock signal TCK, a test data input signal TDI, a test mode select signal TMS. The TAP can output a test data output signal TDO. Various control signals provided by the TAP controller 20, especially in response to TMS signals, select a path between the TDI and TDO ports of the TAP.

The instruction register 18 forms an instruction path while each of the boundary scan register 30, bypass register 12 and the optional user defined data register 14 defines a data path. Each data path and instruction path can be regarded as an internal test path of the TAP.

The TAP controller 20 is a state machine that can apply many stages, including various IEEE standard 1149.1 mandatory states. These mandatory states are controlled by the TMS signal. FIG. 4 illustrates the multiple states of the TAP controller 20: Test logic reset 40, run-test/idle 41, select DR scan 42, capture DR 43, shift DR 44, exit1 DR 45, pause DR 46, exit2 DR 47, update DR 48, select IR scan 52, capture IR 53, shift IR 54, exit1 IR 55, pause IR 56, exit2 IR 57 and update IR 58. The stages are illustrates as boxes that are linked to each other by arrows. The arrows are accompanied by digits (either 0 or 1) that illustrate the value of the TMS signal. These stages are well known in the art and require no further explanation.

Generally, the TAP controller 20 sends control signals that allow to input information into selected data and instruction paths, to retrieve information from said paths and to serially propagate (shift) information along data and instruction paths.

The boundary scan register 30 includes multiple boundary scan cells (denoted BSC) 32. Some BSCs are connected to input pad circuits 26 while others are connected, via PCNTs 29 to IO pad 28. Especially, each IO pad 28 is connected to a PCNT 29 that can receive configuration signals (denoted "control") from core 11, data from certain BSCs and enable signals from other BSCs 32. A pair of BSCs are allocated for each IO pad 28.

FIG. 3 illustrates a prior art integrated circuit 9' that includes IO pads 28, a TAP and a control selection multiplexer 23. For simplicity of explanation some registers were omitted.

Integrated circuit 9' differs from integrated circuit 9 by including a control selection multiplexer 23 that can send to PCNTs 29 either (i) IO pad circuit configuration signals provided by core 11 or (ii) configuration signals generated by the TAP. The latter is usually provided during test mode while the former is provided during normal mode. A PCNT 29 can receive enable signals from one BSC, a data signal from another BSC and IO pad circuit configuration signals from control multiplexer 23.

The IO pad circuit configuration signals usually include multiple signals thus requiring complex and area consuming IO channels.

There is a growing need to provide efficient devices and methods for programming IO pad circuits.

SUMMARY OF THE PRESENT INVENTION

A device and a method for programming IO pads, as described in the accompanying claims.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

Figure 1:
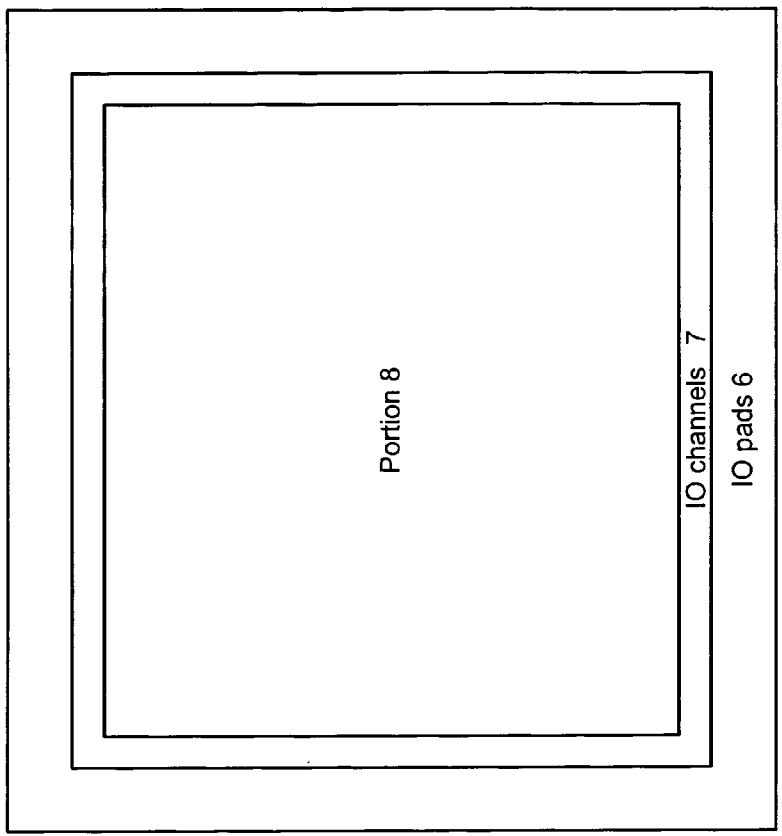
FIG. 1 illustrates a lower part of an integrated circuit.
Figure 2:
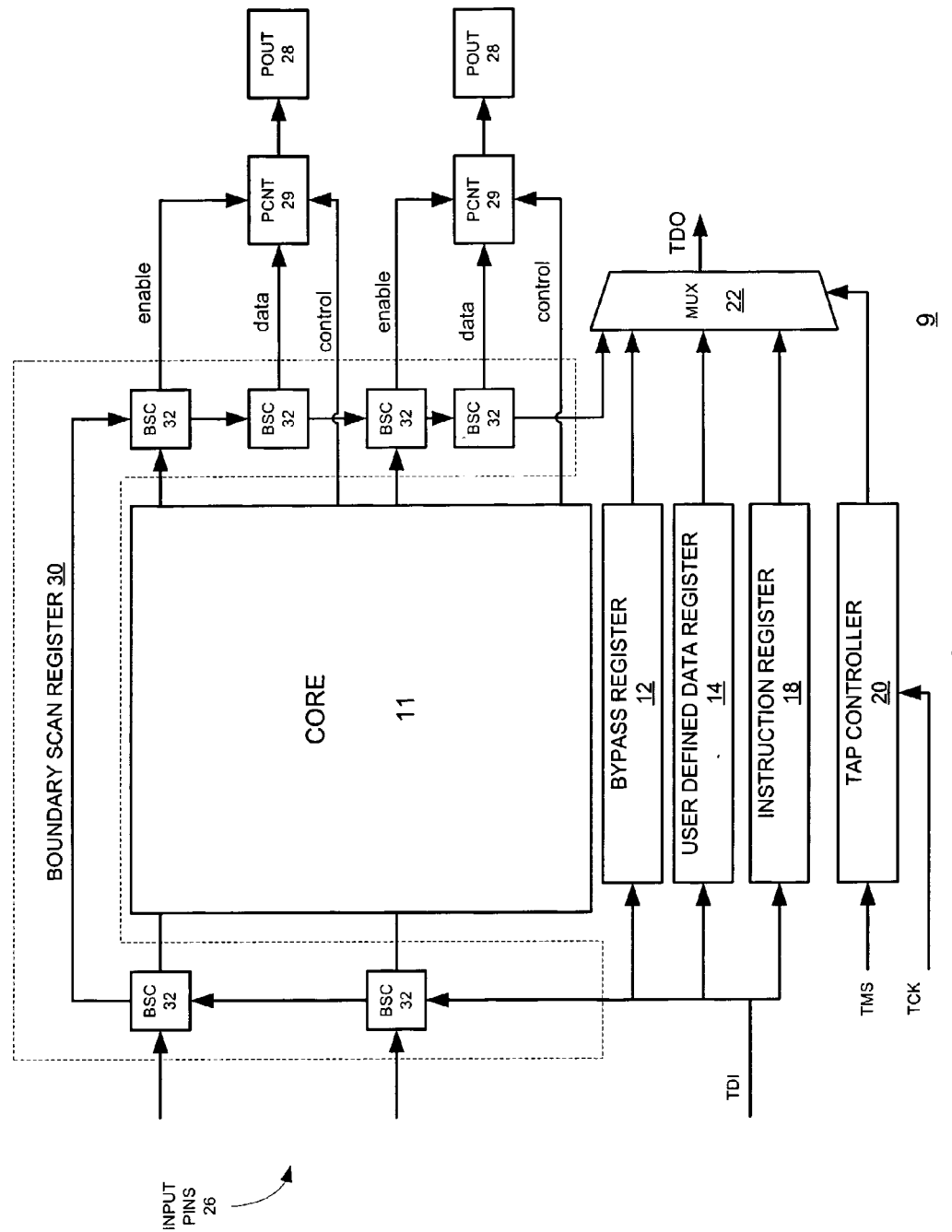
FIG. 2 illustrates a prior art integrated circuit that includes IO pad circuits that can receive information from JTAG compliant boundary scan cells, and receive IO pad configuration signals from a core.
Figure 3:
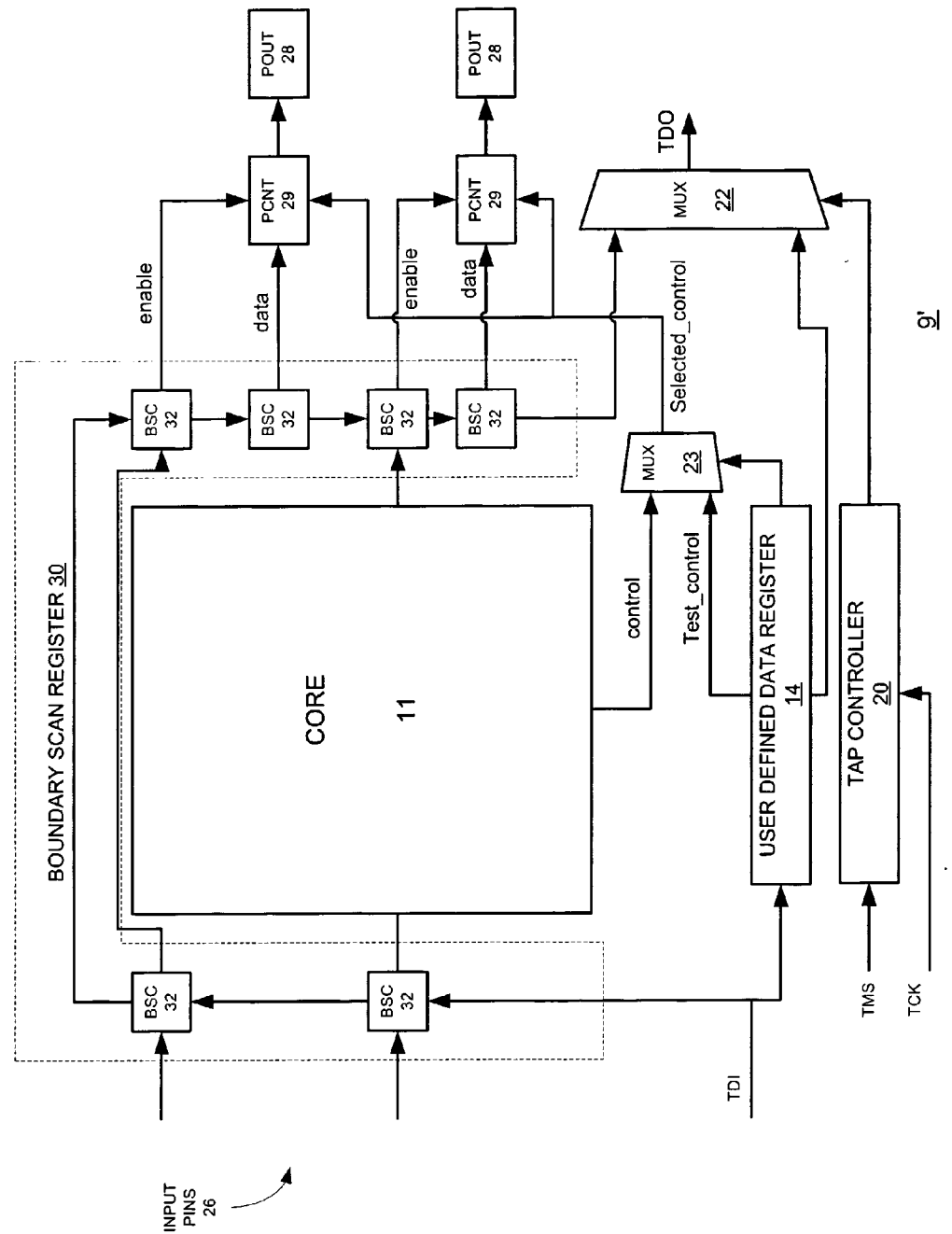
FIG. 3 illustrates a prior art integrated circuit that includes IO pad circuits, a TAP and a control selection multiplexer.
Figure 4:
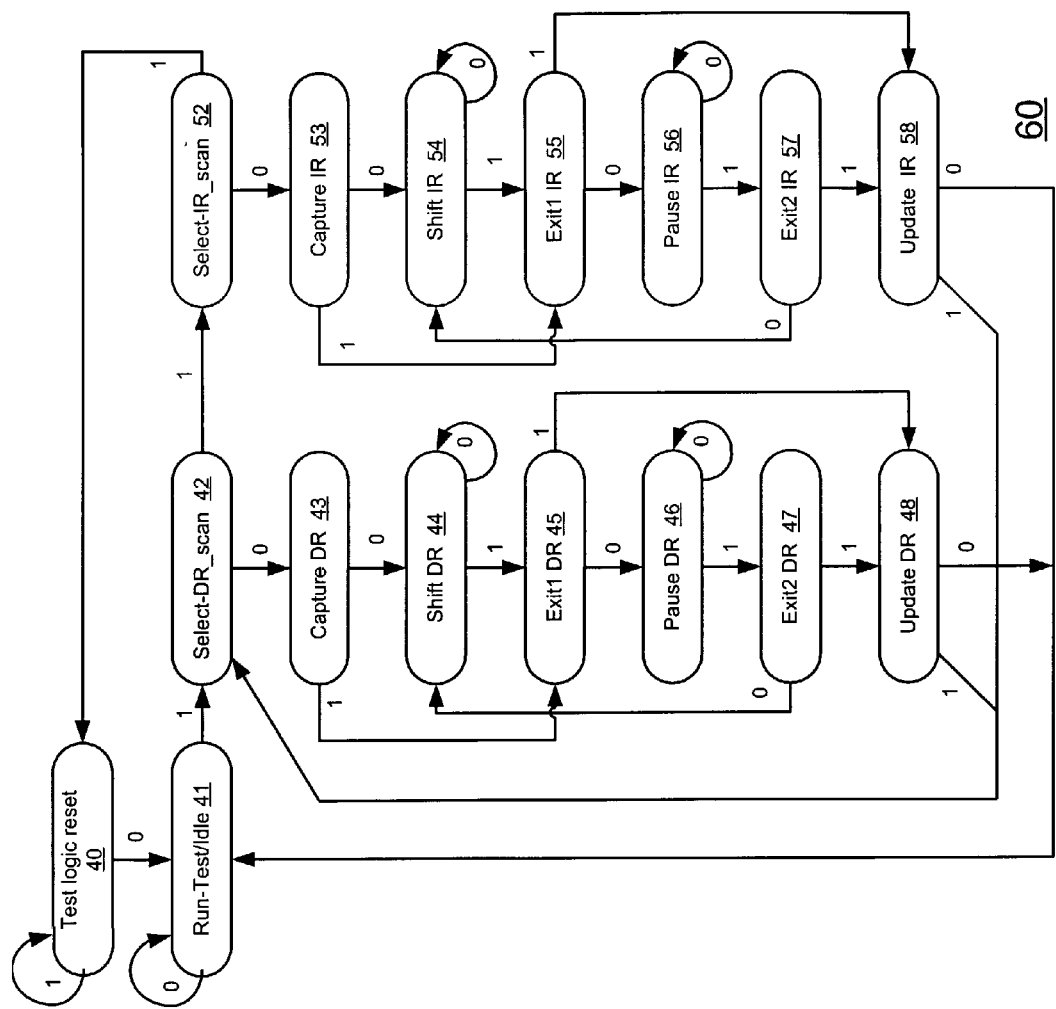
FIG. 4 illustrates the multiple states of the TAP controller.

A device that uses a boundary scan register to provide data and configuration information to IO pad circuits. Typically, configuration information includes multiple bits. A boundary scan register is used to provide configuration information during multiple write sessions.

During each write session multiple IO pad circuits receive a certain pad configuration bit. In addition, the same boundary scan register is used to convey data. One or more selection signals select the destination of the data an/or the configuration bits.

A method for configuring IO pads is provided. The method includes determining a current configuration of multiple IO pads of an integrated circuit, generating multiple boundary scan register words that include configuration information, and repeating the stage of serially writing a certain boundary scan register word to a boundary scan register and outputting the boundary scan register word to multiple IO pad control circuits. The repetition ends once a predefined amount of different boundary scan words is written.

Conveniently, the generating includes converting multiple configuration information words to multiple boundary scan register words. Conveniently, each IO pad control circuit includes multiple control paths and the writing includes sending a boundary scan register bit to a selected control path. Conveniently, each IO pad control circuit includes multiple latches and the writing includes sending a boundary scan register bit to a selected latch out of the multiple latches.

Conveniently, the method further includes providing data to the IO pad circuits via the boundary scan register. Conveniently, the providing includes sending data via one data path within an IO pad control circuit and whereas the writing includes sending a boundary register bit via a control path out of multiple control paths within an IO pad control circuit.

Conveniently, the method also includes comparing a current boundary scan word to a corresponding previously written boundary scan word and determining, in response to the comparison, whether to write the current boundary scan word.

A device is provided. The device includes a core, a boundary scan register, a TAP controller, multiple IO pad circuits and a control circuit. The control circuit is adapted to determine a current configuration of the IO pad circuits, to generate multiple boundary scan register words that include configuration information; and to control a repetition of: (i) writing a certain boundary scan register word to the boundary scan register and (ii) outputting the boundary scan register word to multiple IO pad control circuits.

Conveniently, the control circuit is adapted to convert multiple configuration information words to multiple boundary scan register words. Conveniently, each IO pad control circuit includes multiple control paths and a selection circuit adapted to send a boundary scan register bit to a selected control path. Conveniently, each control path includes a latch.

Conveniently, an IO pad control circuit also includes a data path for providing data to an IO pad circuit. Conveniently, the device is adapted to send data via one data path within an IO pad control circuit and to send a boundary register bit via a control path out of multiple control paths within an IO pad control circuit.

Conveniently, the device is adapted to compare a current boundary scan word to a corresponding previously written boundary scan word and determine, in response to the comparison, whether to write the current boundary scan word.

Figure 5:
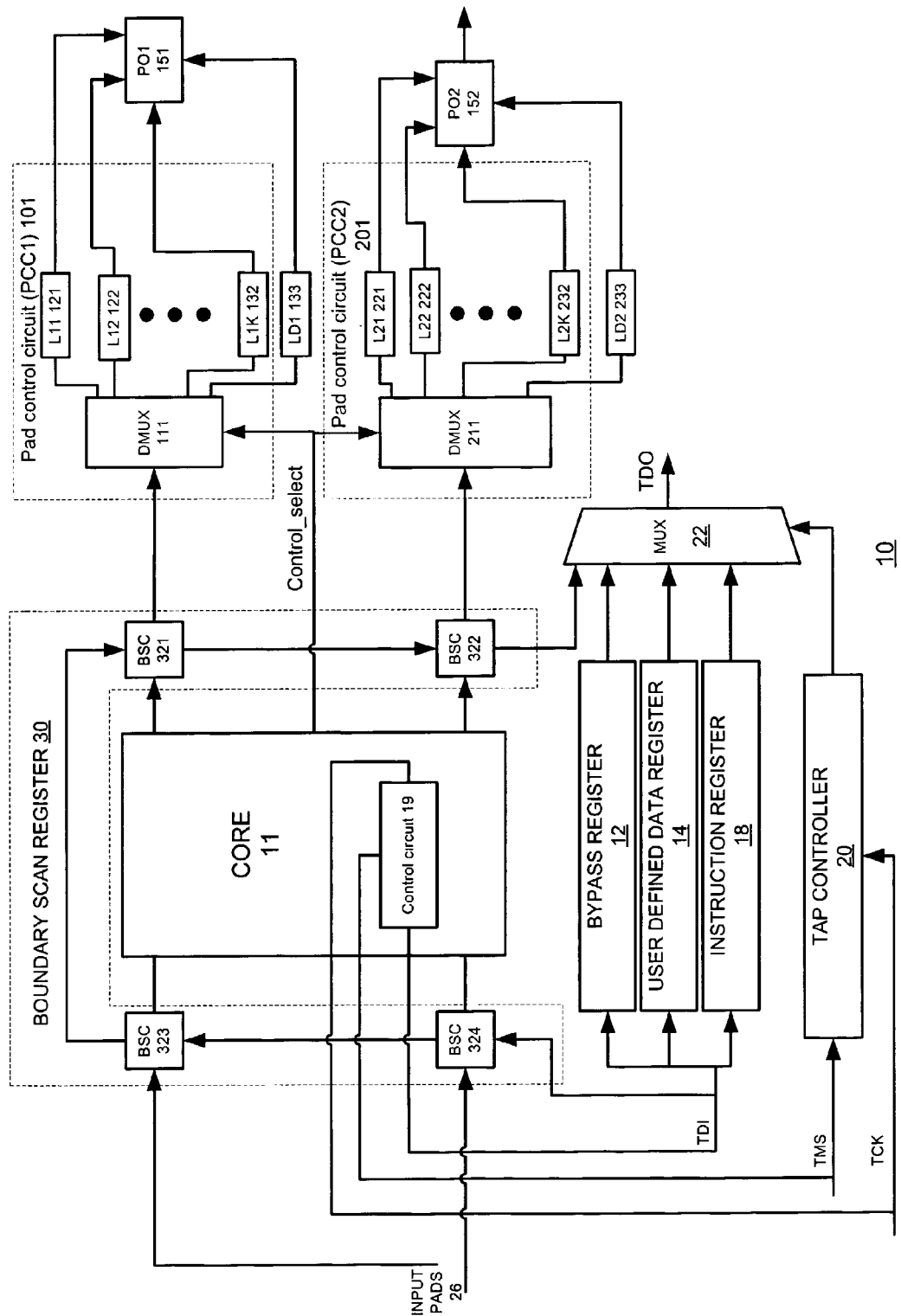
FIG. 5 illustrates a device according to an embodiment of the invention.

FIG. 5 illustrates a device 10 according to an embodiment of the invention.

Device 10 can be an integrated circuit or can include one or more integrated circuits. It can be a mobile phone, a computer, a personal data accessory and the like.

FIG. 5 illustrates a limited amount of boundary scan cells and IO pads, as well as only few components of device 10. It is noted that the amount of boundary scan cells usually exceeds the amount illustrated in FIG. 5, that device 10 usually includes multiple components (such as but not limited to memory units, additional cores, logic, peripherals and the like).

Device 10 includes a core 11, boundary scan register 30, two pad control circuits (PCC1 101 and PCC2 201), two IO pads 151 and 152, bypass register 12, instruction register 18, TAP controller 20, multiplexer 22 and an optional user defined data register 14. The TAP receives TDI, TMS and TCK signals (generated by control circuit 19) and outputs, via multiplexer 22, a TDO signal. Boundary scan register 30 includes boundary scan cells 321-324. Boundary scan cells 323 and 324 are connected to input pads 26. Boundary scan cells 321 and 322 are connected to IO pads 151 and 152 accordingly, via pad control circuits 101 and 201.

It is assumed that K bits are required to configure a single IO pad circuit. It is also assumed that the device 11 includes J IO pads (such as PO1-POJ 150 of FIG. 8), including IO pads 151 and 152. In order to configure the J IO pads K write sessions are required. It is assumed that index k represents the write session and that k ranges between 1 and K. The k'th write sequence includes serially loading a k'th boundary scan register word (which is J-bit long) to the J boundary scan cells that form boundary scan register 30. Once the boundary scan register is loaded (within BSC1-BSCJ 32 of FIG. 8) the J boundary scan cells outputs the k'th boundary scan register word to J pad control circuits (such as PCC1-PCCJ 100 of FIG. 8). Conveniently, each pad control circuit (such as PCC1 101) includes a de-multiplexer (such as de-multiplexer 111). Each de-multiplexer also receives a control_select signal that indicates where to store the received bit. These bits are then used to configure the J IO pads.

The boundary scan register words are written to the boundary scan register 30 via TDI input. It is noted that signals TDI, TMS, TCK can be provided by control circuit 19, another component of core 11 or by one or more components of an integrated circuit or by an external testing circuit.

The first IO pad control circuit 111 is connected to PO1 151. The second IO pad circuit 201 is connected to PO2 152.

The first pad control circuit 101 includes de-multiplexer 111 and multiple (K+1) latches L11-LD1 121-133. K latches L11-L1K 121-132 are used to store configuration bits while LD1 133 stores data. De-multiplexer 111 receives a control_select signal from core 11 and in response determines to which latch (out of L11-L1K 121-132) to send data or a configuration bit received from boundary scan cell 321. The content of latches L11-L1K 121-132 determine the configuration of IO pad 151.

The second pad control circuit 201 includes de-multiplexer 211 and multiple (K+1) latches L21-LD2 221-233. K latches L21-L2K 221-232 are used to store configuration bits while LD2 233 stores data. De-multiplexer 211 receives a control_select signal from core 11 and in response determines to which latch (out of L21-L2K 221-232) to send data or a configuration bit received from boundary scan cell 322. The content of latches L21-L2K 221-232 determine the configuration of IO pad 152.

Figure 6:
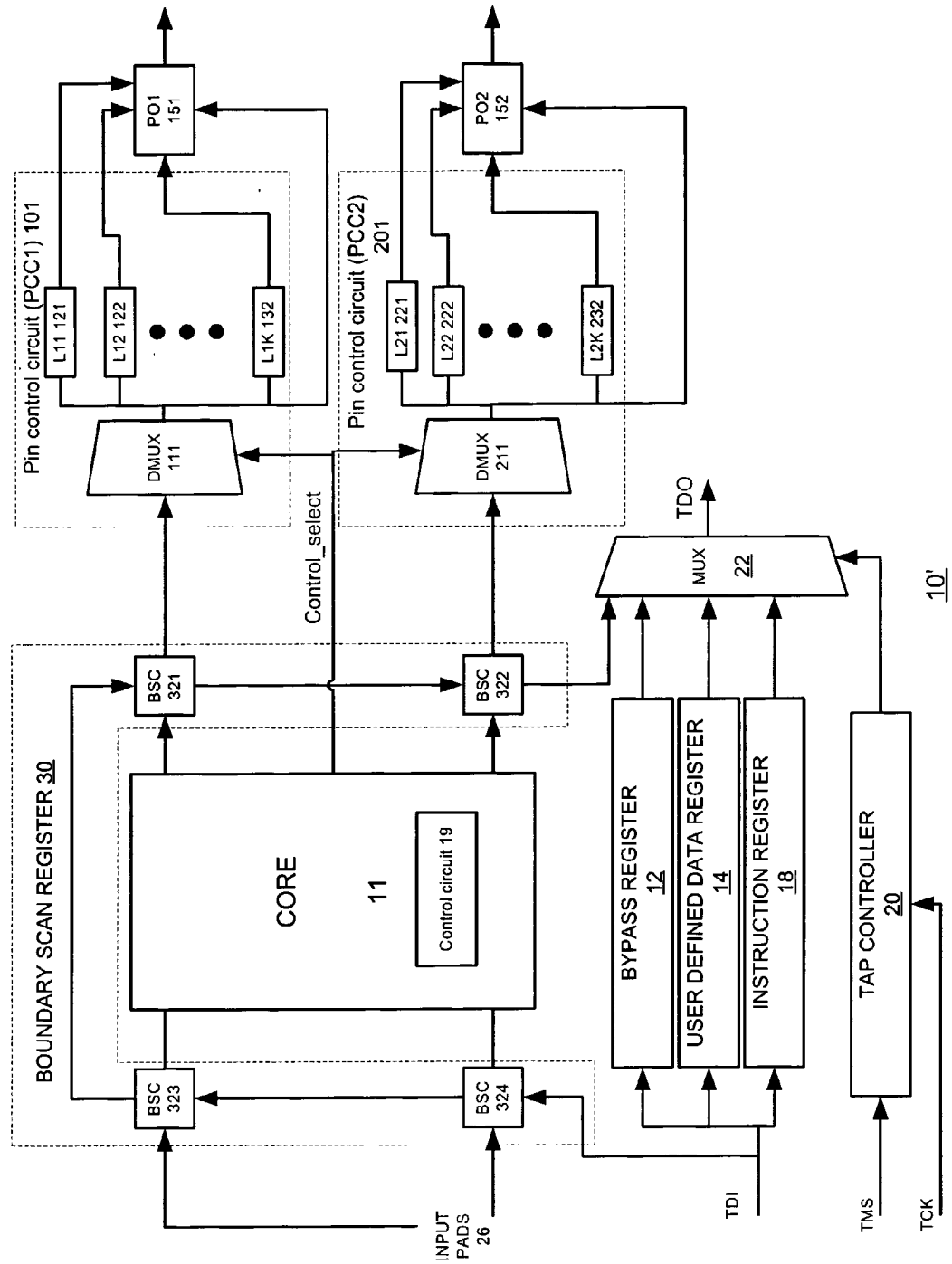
FIG. 6 illustrates a device according to another embodiment of the invention.

FIG. 6 illustrates a device 10' according to an embodiment of the invention. Device 10' of FIG. 6 differs from device 10 of FIG. 5 by including a data path that does not include data latches. Instead of providing data via de-multiplexers 111 and 211 to latches L1D 133 and L2D 233 to IO pads 151 and 152, the data is sent from de-multiplexers 111 and 211 to IO pads 151 and 152

According to an embodiment of the invention device 11 (or device 10') can perform K writing sessions whenever the IO pads need to be configured. According to an embodiment of the invention device 11 (or device 11') can perform fewer writing cycles, if at least one current boundary scan register word equals the corresponding last written boundary scan register word.

Figure 7:
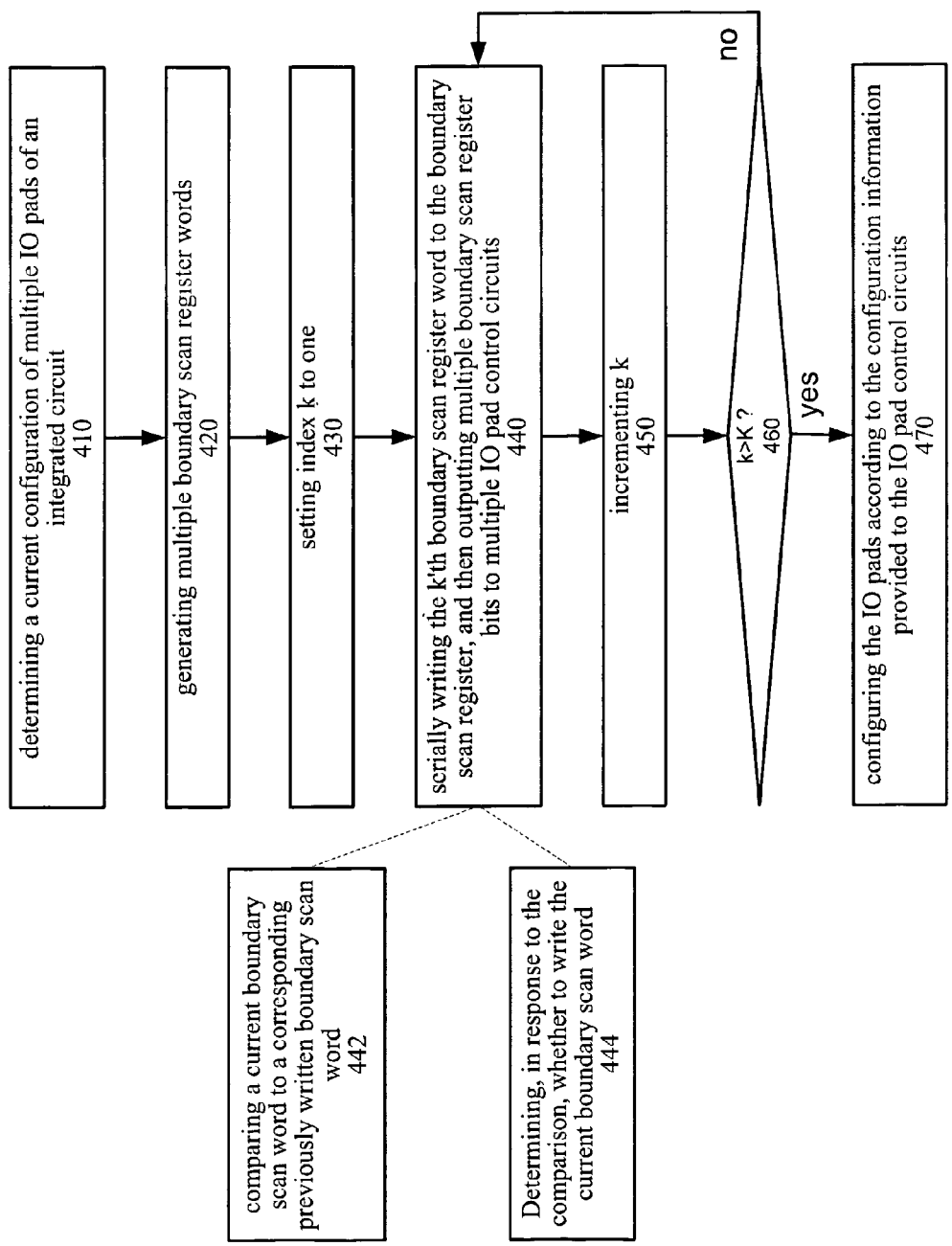
FIG. 7 illustrates a method for configuring IO pads, according to an embodiment of the invention.
Figure 8:
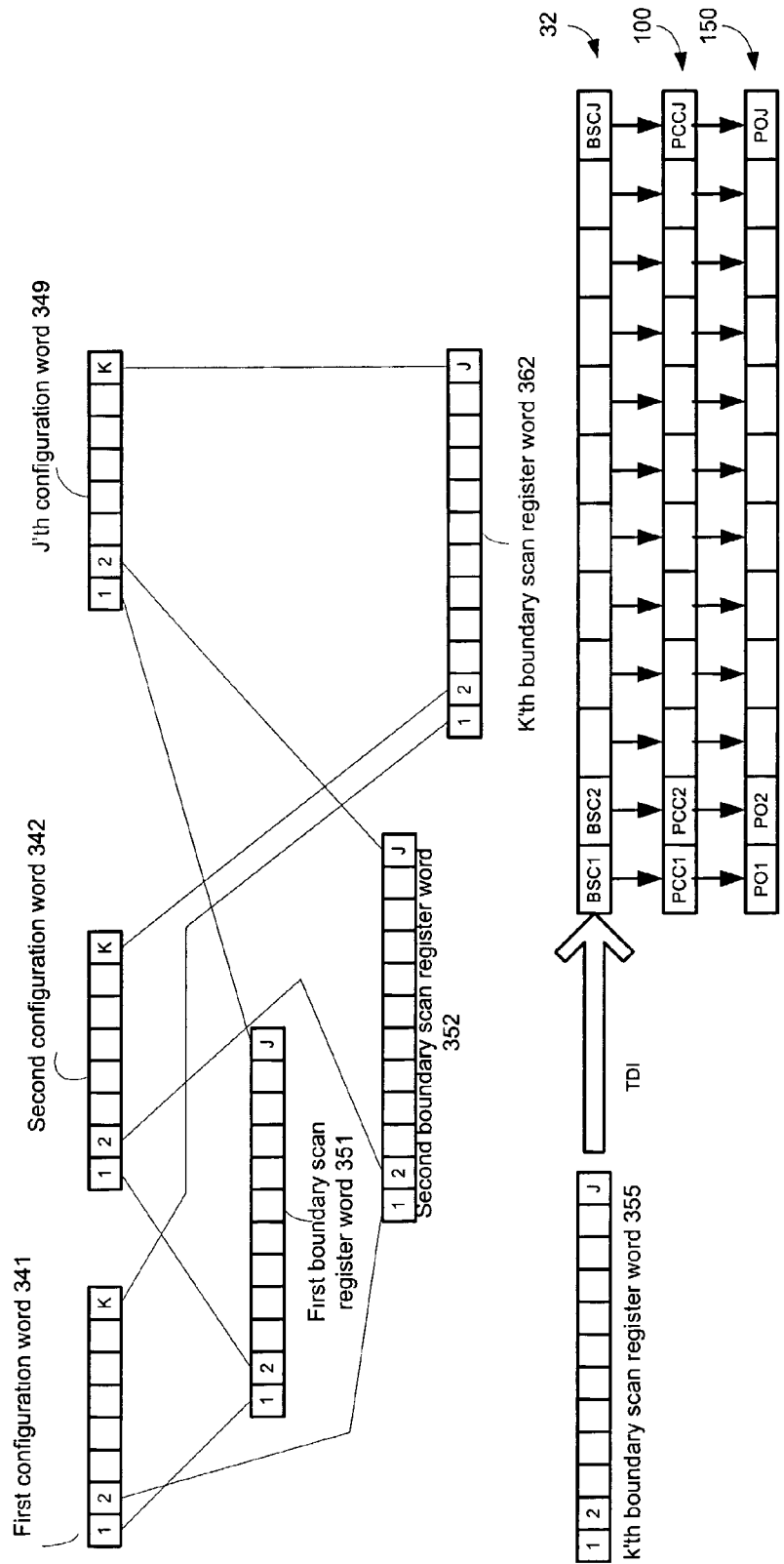
FIG. 8 illustrates the relationship between configuration words and boundary scan words, as well as writing and reading stages of a boundary scan register word, according to an embodiment of the invention.

FIG. 7 illustrates a method 400 for configuring IO pads, according to an embodiment of the invention. FIG. 8 illustrates the relationship between configuration words and boundary scan words, as well as writing and reading stages of a boundary scan register word, according to an embodiment of the invention. For simplicity of explanation FIG. 8 only illustrates the first, second and Jth configuration words as well as the first, second and K'th boundary scan register words. For clarity of explanation a writing process of a k'th boundary scan register 355 is illustrated. It is noted that a similar process is applied whenever a boundary scan word is written.

Method 400 starts by stage 410 of determining a current configuration of multiple IO pads of an integrated circuit. The determination can be responsive to a currently implemented function of the IO pads. Stage 410 may include generating multiple (for example J) configuration information words that determine the configuration of the J IO pads. It is assumed that the j'th IO configuration word includes K bits and determines the configuration of the j'th IO pad. Referring to the example set forth in FIG. 8, configuration words 341-349 are generated. Each configuration information word includes K bits.

Stage 410 is followed by stage 420 of generating multiple boundary scan register words. Each boundary scan register word may include multiple configuration bits that are should affect multiple IO pads. For example, the k'th boundary scan register word can include the k'th bits of the configuration information words.

Referring to the example set forth in FIG. 8, K boundary scan register words 351-362 are generated. The first boundary scan register word 351 includes the first bit of each of the J configuration words 341-349. The second boundary scan register word 352 includes the second bit of each of the J configuration words 341-349. The K'th boundary scan register word 362 includes the K'th bit of each of the J IO pad configuration words 341-349.

Stage 420 is followed by stages 430, 440, 450 and 460 that cause the multiple boundary scan register words to be serially written to the boundary scan register and to be written to multiple IO pad control circuits that are connected in parallel to multiple boundary scan cells of the boundary scan register.

Referring to the example set forth in FIG. 8, a k'th boundary scan register word 355 is serially written (using TDI signals) to the J boundary scan cells (BSC1-BSCJ, collectively denoted 32) that form the boundary scan register 30. Once the whole boundary scan word is written the boundary scan cells BSC1-BSCJ (collectively denoted 32) send multiple boundary scan register bits to pad control circuits PCC1-PCCJ (collectively denoted 100) that are connected to these boundary scan cells. Each pad control circuit sends a configuration information word to the corresponding IO pad (PO1-POJ, collectively denoted 150). The first IO pad P01 receives the first configuration word 341, the second IO pad PO2 receives the second configuration word 342, and the K'th IO pad POK receives the K'th configuration word 349.

Stage 430 includes setting index k to one (k=1).

Stage 430 is followed by stage 440 of serially writing the k'th boundary scan register word to the boundary scan register, and then outputting multiple boundary scan register bits to multiple IO pad control circuits. Conveniently, stage 440 includes receiving the bits by de-multiplexers and selecting a selected latch to receive the bits.

Stage 440 can include stage 442 of comparing a current boundary scan word to a corresponding previously written boundary scan word and stage 444 of determining, in response to the comparison, whether to write the current boundary scan word.

Stage 440 is followed by stage 450 of incrementing k (k=k+1). Stage 450 is followed by stage 460 of checking if k is greater than K. if the answer is negative then stage 460 is followed by stage 430, else stage 460 is followed by stage 470 of configuring the IO pads according to the Configuration information provided to the IO pad control circuits.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A method for configuring IO pads of an integrated circuit, the method comprises:
    determining a current configuration of multiple IO pads;
    generating multiple boundary scan register words that comprise configuration information; and
    repeating the stage of serially writing a certain boundary scan register word to a boundary scan register and outputting the boundary scan register word to multiple IO pad control circuits;
    wherein a k'th boundary scan register word comprises k'th bits of multiple configuration information words;
    wherein the configuration information comprises IO drive strength information.

2. The method according to claim 1 whereas the generating comprises converting multiple configuration information words to the multiple boundary scan register words.

3. The method according to claim 1 whereas each IO pad control circuit comprises multiple control paths and whereas the writing comprises sending a boundary scan register bit to a selected control path.

4. The method according to claim 3 whereas each IO pad control circuit comprises multiple latches and whereas the writing comprises sending a boundary scan register bit to a selected latch out of the multiple latches.

5. The method according to claim 1 further comprising providing data to the IO pads via the boundary scan register.

6. The method according to claim 5 whereas the providing comprises sending data via one data path within an IO pad control circuit and whereas the writing comprises sending a boundary register bit via a control path out of multiple control paths within an IO pad control circuit.

7. The method according to claim 1 further comprising comparing a current boundary scan word to a corresponding previously written boundary scan word and determining, in response to the comparison, whether to write the current boundary scan word.

8. A device, comprising:
a core, coupled to a boundary scan register;
a TAP controller;
multiple IO pads;
a control circuit adapted to determine a current configuration of the IO pad circuits, to generate multiple boundary scan register words that comprise Configuration information; and
to control a repetition of writing a certain boundary scan register word to the boundary scan register and outputting the boundary scan register word to multiple IO pad control circuits;
wherein a k'th boundary scan register word comprises k'th bits of multiple configuration information words;
wherein the configuration information comprises IO drive strength information.

9. The device according to claim 8 whereas the control circuit is adapted to convert multiple Configuration information words to the multiple boundary scan register words.

10. The device according to claim 8 whereas each IO pad control circuit comprises multiple control paths and a selection circuit adapted to send a boundary scan register bit to a selected control path.

11. The device according to claim 10 whereas each control path comprises a latch.

12. The device according to claim 8 further comprising a data path for providing data to an IO pad circuit.

13. The device according to claim 12 further adapted to send data via one data path within an IO pad control circuit and to send a boundary register bit via a control path out of multiple control paths within an IO pad control circuit.

14. The device according to claim 8 whereas the control circuit is adapted to compare a current boundary scan word to a corresponding previously written boundary scan word and determine, in response to the comparison, whether to write the current boundary scan word.

15. The method according to claim 2 whereas each IO pad control circuit comprises multiple control paths and whereas the writing comprises sending a boundary scan register bit to a selected control path.

16. The method according to claim 2 further comprising providing data to the IO pads via the boundary scan register.

17. The method according to claim 2 further comprising comparing a current boundary scan word to a corresponding previously written boundary scan word and determining, in response to the comparison, whether to write the current boundary scan word.

18. The method according to claim 3 further comprising providing data to the IO pads via the boundary scan register.

19. The device according to claim 9 whereas each IO pad control circuit comprises multiple control paths and a selection circuit adapted to send a boundary scan register bit to a selected control path.

20. The device according to claim 9 further comprising a data path for providing data to an IO pad circuit.

* * * * *